US012765311B2

(12) United States Patent
Yamamoto et al.

(10) Patent No.: US 12,765,311 B2
(45) Date of Patent: Oct. 13, 2026

(54) SUBSTRATE PROCESSING SYSTEM, SUBSTRATE PROCESSING APPARATUS, METHOD OF MANUFACTURING SEMICONDUCTOR DEVICE, AND RECORDING MEDIUM

(71) Applicant: Kokusai Electric Corporation, Tokyo (JP)

(72) Inventors: Kazuyoshi Yamamoto, Toyama (JP); Hidemoto Hayashihara, Toyama (JP); Kayoko Yashiki, Toyama (JP); Kyohei Kita, Toyama (JP); Kazuhide Asai, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 536 days.

(21) Appl. No.: 18/339,997

(22) Filed: Jun. 22, 2023

(65) Prior Publication Data

US 2024/0014055 A1 Jan. 11, 2024

(30) Foreign Application Priority Data

Jun. 30, 2022 (JP) ................................ 2022-106151

(51) Int. Cl.
*H10P 72/00* (2026.01)
*G05B 19/042* (2006.01)
(Continued)

(52) U.S. Cl.
CPC ........ *H10P 72/0612* (2026.01); *G05B 19/042* (2013.01); *G05B 19/4183* (2013.01);
(Continued)

(58) Field of Classification Search
CPC ......... H01L 21/67276; H01L 21/67248; H01L 21/67253; H01L 21/67712; G05B 19/042; G05B 19/4183
(Continued)

(56) References Cited

U.S. PATENT DOCUMENTS

2005/0187649 A1* 8/2005 Funk .................. G05B 23/0259 700/121
2007/0043867 A1* 2/2007 Shigeta ................... G06F 21/78 709/226
(Continued)

FOREIGN PATENT DOCUMENTS

JP 2006501680 A 1/2006
JP 2007-234124 A 9/2007
(Continued)

OTHER PUBLICATIONS

Microsoft, "4660(S): an object was deteled", 2021; retrieved from https://learn.microsoft.com/en-us/previous-versions/windows/it-pro/windows-10/security/threat-protection/auditing/event-4660 on Aug. 20, 2025 (Year: 2021).*
(Continued)

*Primary Examiner* — Mohammad Ali
*Assistant Examiner* — Joshua T Sanders
(74) *Attorney, Agent, or Firm* — Volpe Koenig

(57) ABSTRACT

There is provided a technique, which includes: at least one substrate processing apparatus including a controller configured to be capable of controlling processing of a substrate according to a recipe including at least one step and a first memory configured to be capable of storing data of the at least one substrate processing apparatus that is reported during the processing of the substrate; and a data manager connected to the at least one substrate processing apparatus, configured to acquire the data, and configured to be capable
(Continued)

of specifying the number of the at least one step that is included in the data to be acquired such that the data falls within a predefined data acquirable range.

16 Claims, 8 Drawing Sheets

(51) Int. Cl.
*G05B 19/418* (2006.01)
*H10P 72/30* (2026.01)

(52) U.S. Cl.
CPC ...... *H10P 72/0602* (2026.01); *H10P 72/0604* (2026.01); *H10P 72/3206* (2026.01); *G05B 2219/45031* (2013.01)

(58) Field of Classification Search
USPC .......................................................... 700/121
See application file for complete search history.

(56) References Cited

U.S. PATENT DOCUMENTS

2008/0040061 A1* 2/2008 Osada ............... H01J 37/32935 702/82
2009/0118855 A1 5/2009 Joho
2009/0125276 A1* 5/2009 Koizumi ........... H01L 21/67276 702/182
2010/0023151 A1* 1/2010 Shieh ............... G05B 19/41885 700/121
2011/0010133 A1* 1/2011 Swanson .................. H04Q 9/00 702/187
2012/0215450 A1* 8/2012 Ashok ................ G05B 23/0262 702/9

FOREIGN PATENT DOCUMENTS

| | | | | |
|---|---|---|---|---|
| JP | 2007287843 | A | * | 11/2007 |
| JP | 2008-042005 | A | | 2/2008 |
| JP | 2009-094143 | A | | 4/2009 |
| JP | 2009-169882 | A | | 7/2009 |
| JP | 2010-225617 | A | | 10/2010 |
| JP | 2014-011255 | A | | 1/2014 |
| WO | 2007/122902 | A1 | | 11/2007 |

OTHER PUBLICATIONS

Korean Office Action issued on Dec. 24, 2024 for Korean Patent Application No. 10-2023-0081054.
The technology supporting big data 4. big data and data acquisition (Oct. 2, 2021. blog letter) of the streaming type (https://dianakang.tistory.com/m/40?t&utm_source=perplexity).
Extended European Search Report issued on Dec. 14, 2023 for European Patent Application No. 23181164.7.
Japanese Office Action issued on Feb. 4, 2025 for Japanese Patent Application No. 2022-106151.
Taiwan Office Action issued on Mar. 19, 2024 for Taiwan Patent Application No. 112115088.

* cited by examiner

SUBSTRATE PROCESSING SYSTEM, SUBSTRATE PROCESSING APPARATUS, METHOD OF MANUFACTURING SEMICONDUCTOR DEVICE, AND RECORDING MEDIUM

CROSS-REFERENCE TO RELATED APPLICATION

This application is based upon and claims the benefit of priority from Japanese Patent Application No. 2022-106151, filed on Jun. 30, 2022, the entire contents of which are incorporated herein by reference.

TECHNICAL FIELD

The present disclosure relates to a substrate processing system, a substrate processing apparatus, a method of manufacturing a semiconductor device, and a recording medium.

BACKGROUND

When manufacturing a semiconductor device such as a large scale integrated circuit (LSI) or a dynamic random access memory (DRAM), generally, a substrate processing apparatus is used to perform various types of processing on a semiconductor substrate such as a silicon (Si) wafer (hereinafter simply referred to as "substrate" or "wafer"). Further, as such a substrate processing apparatus, for example, in the related art, there is provided a substrate processing apparatus communicably connected to a group controller and configured to manage various data of the substrate processing apparatus by the group controller.

When managing one or a plurality of substrate processing apparatuses by a data manager such as the group controller provided in the related art, various process data (hereinafter simply referred to as "data") obtained by sensors mounted on the substrate processing apparatus during execution of substrate processing may be acquired. Then, by using the data acquired in this manner, analysis may be performed, for example, to know a state of the substrate processing apparatus to be managed. To acquire such data, the data manager searches and extracts target data from various data stored in one substrate processing apparatus.

In a case where the number of sensors installed in one substrate processing apparatus is large or contents of the substrate processing to be performed are complicated, a total data size of the data acquired in one substrate processing apparatus described above becomes large. Therefore, in some cases, the data size of the data may exceed a size that may be held in a memory of the data manager, and processing such as data acquisition and data format conversion after acquisition may not be performed stably.

SUMMARY

Some embodiments of the present disclosure provide a technique capable of stably acquiring data held by a substrate processing apparatus.

According to some embodiments of the present disclosure, there is provided a technique, which includes: at least one substrate processing apparatus including a controller configured to be capable of controlling processing of a substrate according to a recipe including at least one step and a first memory configured to be capable of storing data of the at least one substrate processing apparatus that is reported during the processing of the substrate; and a data manager connected to the at least one substrate processing apparatus, configured to acquire the data, and configured to be capable of specifying the number of the at least one step that is included in the data to be acquired such that the data falls within a predefined data acquirable range.

BRIEF DESCRIPTION OF DRAWINGS

The accompanying drawings, which are incorporated in and constitute a part of the specification, illustrate embodiments of the present disclosure.

DETAILED DESCRIPTION

Figure 1:
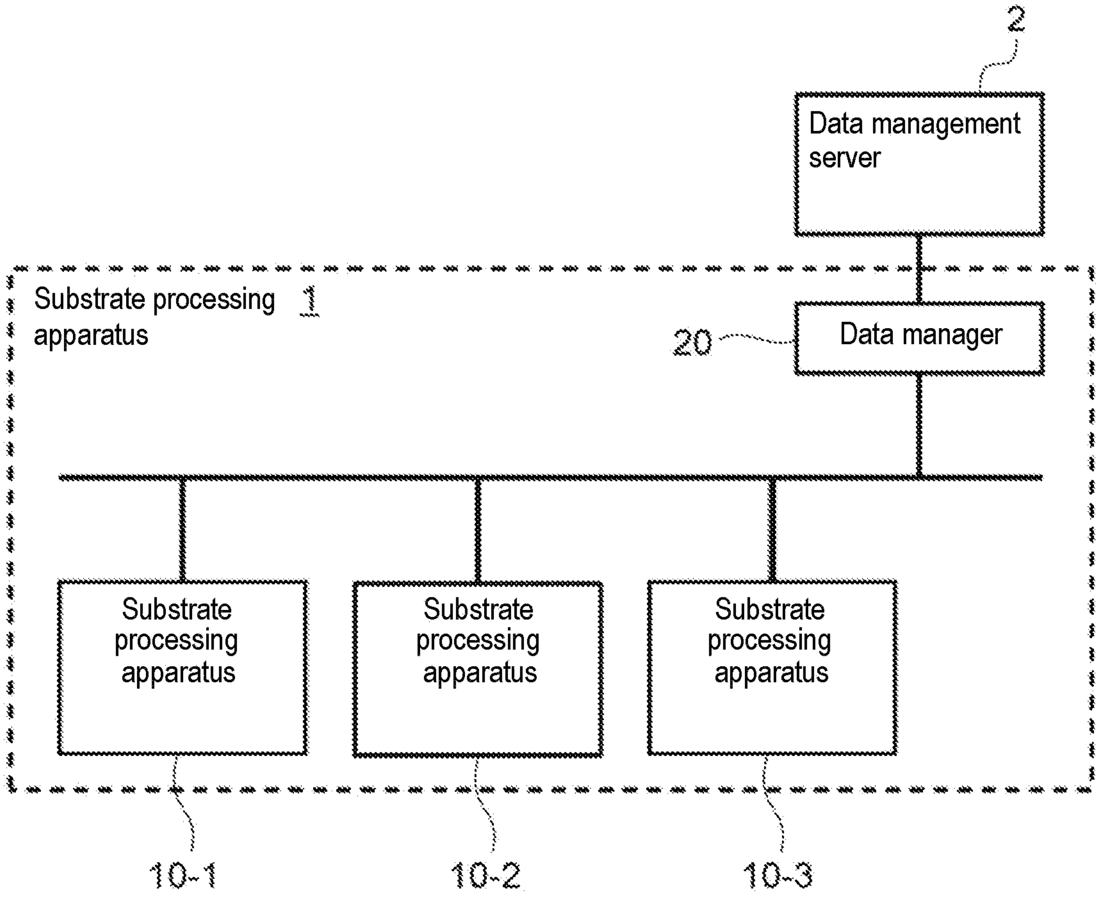
FIG. 1 is a schematic configuration diagram showing an example of a substrate processing system according to embodiments of the present disclosure.

Hereinafter, embodiments in which the present disclosure is carried out will be described with reference to the drawings. The drawings used in the following description are schematic, and dimensional relationships of the respective components, ratios of the respective components, and the like shown in the drawings may not match actual ones. Furthermore, dimensional relationships of the respective components, ratios of the respective components, and the like may not match among a plurality of drawings.

<Schematic Configuration of Substrate Processing System>

FIG. 1 is a schematic configuration diagram showing an example of a substrate processing system according to embodiments of the present disclosure. As shown in FIG. 1, the substrate processing system 1 according to the embodiments of the present disclosure includes one or more (three in FIG. 1) substrate processing apparatuses 10-1, 10-2 and 10-3, and a data manager 20 communicably connected to the substrate processing apparatuses 10-1, 10-2 and 10-3.

The substrate processing apparatuses 10-1, 10-2 and 10-3 may be apparatuses configured to perform various processes on wafers 200 constituting semiconductor devices. Further, the data manager 20 may be an apparatus configured to manage the one or more substrate processing apparatuses 10-1, 10-2 and 10-3.

An example of the substrate processing apparatuses 10-1, 10-2 and 10-3 and an example of the data manager 20 will be described in order below. In the following description, a case will be described in which a batch-type substrate processing apparatus 10 configured to process a plurality of substrates at one time is adopted as an example of the plurality of substrate processing apparatuses 10-1, 10-2 and 10-3. However, the substrate processing apparatus according to the present disclosure is not limited to the above-described embodiments, and may be, for example, a single-substrate-type substrate processing apparatus configured to process one or several substrates at a time. Similarly, in the following description, a case will be described in which a substrate processing apparatus 10 including a hot-wall-type process furnace is adopted. However, the substrate processing apparatus according to the present disclosure is not limited to the above-described embodiments, but may be a substrate processing apparatus including a cold-wall-type process furnace.

<Schematic Configuration of Substrate Processing Apparatus>

Figure 2:
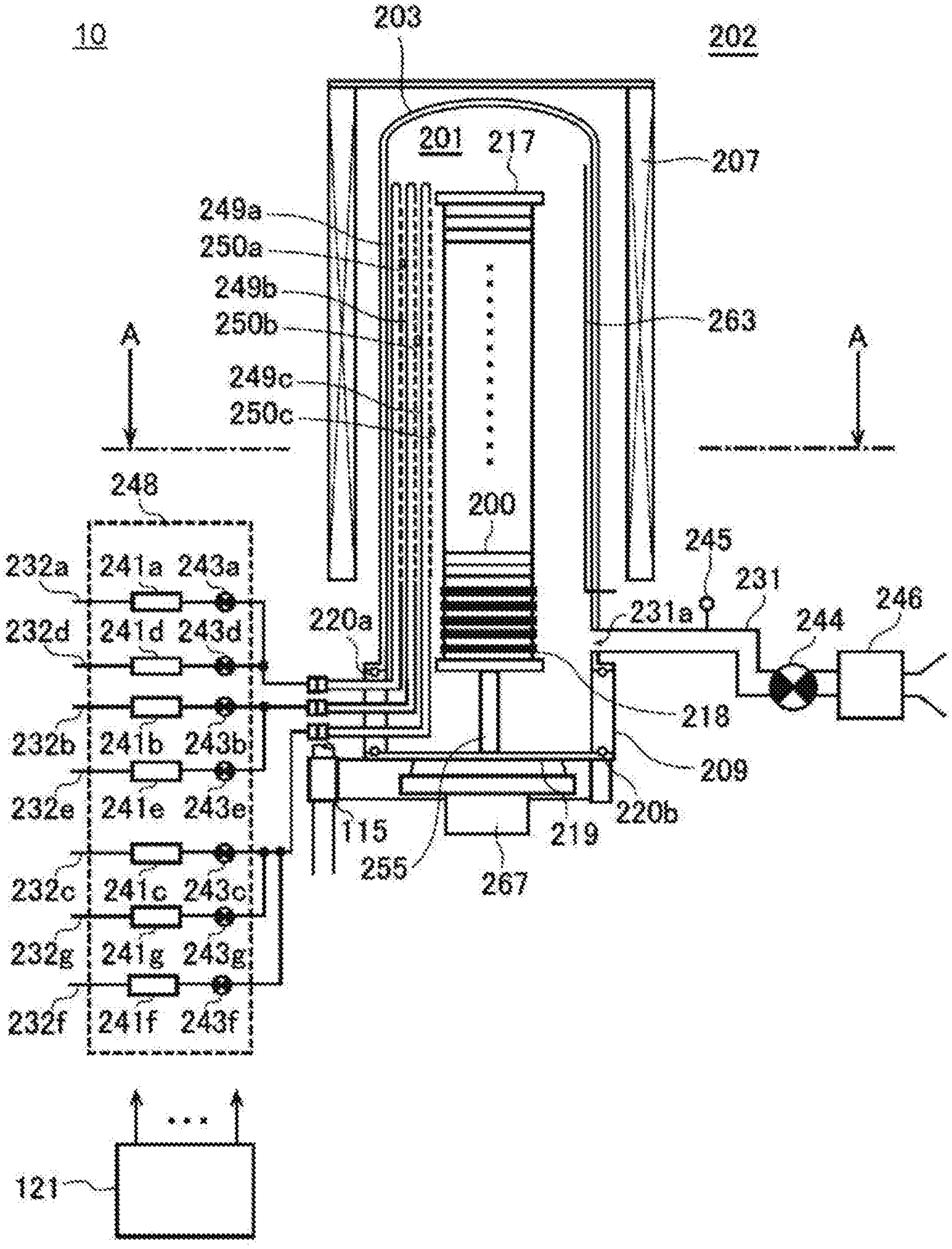
FIG. 2 is a schematic configuration diagram showing an example of a substrate processing apparatus according to embodiments of the present disclosure.

FIG. 2 is a schematic configuration diagram showing an example of a substrate processing apparatus according to embodiments of the present disclosure. In FIG. 2, a vertical process furnace included in one substrate processing apparatus 10 is shown in a vertical cross-sectional view. Further, FIG. 3 is a cross-sectional view taken along line A-A in FIG. 2.

Figure 3:
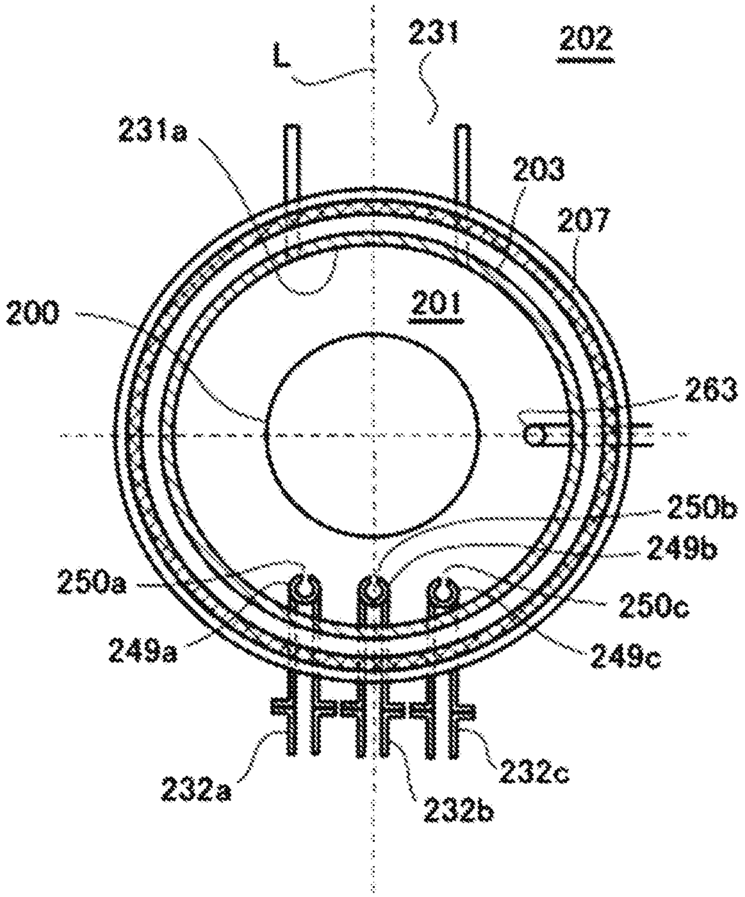
FIG. 3 is a cross-sectional view taken along line A-A in FIG. 2.

As shown in FIGS. 2 and 3, the substrate processing apparatus 10 according to the embodiments of the present disclosure mainly includes a process furnace 202 provided with a heater 207. The heater 207 may be cylindrical, for example, and may be installed vertically by being supported on a holding plate. The heater 207 may also function as an activator (exciter) configured to thermally activate (excite) a gas.

Inside the heater 207, a reaction tube 203 may be arranged concentrically with the heater 207. The reaction tube 203 may be made of heat-resistant material such as quartz ($SiO_2$) or silicon carbide (SiC), and may be formed in a cylindrical shape with a closed upper end and an open lower end. A manifold 209 may be disposed concentrically with the reaction tube 203 below the reaction tube 203. The manifold 209 may be made of, for example, metal material such as stainless steel (SUS) or the like, and may be formed in a cylindrical shape with open upper and lower ends. The upper end of the manifold 209 may be configured to engage with the lower end of the reaction tube 203 and support the reaction tube 203.

An O-ring 220*a* as a seal may be provided between the manifold 209 and the reaction tube 203. The reaction tube 203 may be mounted vertically in the same manner as the heater 207. A process container (reaction container) may mainly include the reaction tube 203 and the manifold 209 described above. The process chamber 201 may be formed in a cylindrical hollow area of the process container. The process chamber 201 may be configured to accommodate wafers 200 as substrates. Various processes may be performed on the wafers 200 within the process chamber 201.

In the process chamber 201, nozzles 249*a* to 249*c* as first to third suppliers may be provided to penetrate a side wall of the manifold 209. These nozzles 249*a* to 249*c* are hereinafter also referred to as first to third nozzles, respectively. The nozzles 249*a* to 249*c* may be made of, for example, heat-resistant material such as quartz or SiC. Gas supply pipes 232*a* to 232*c* may be connected to the nozzles 249*a* to 249*c*, respectively. These three nozzles 249*a* to 249*c* are different nozzles, and each of nozzles 249*a* and 249*c* may be provided adjacent to nozzle 249*b*. In the present disclosure, notation of a range such as "first to third suppliers" means that a minimum value and a maximum value thereof are included in the range.

At the gas supply pipes 232*a* to 232*c*, mass flow controllers (hereinafter also referred to as "MFCs") 241*a* to 241*c*, which are flow rate controllers (flow rate control parts), and valves 243*a* to 243*c*, which are on-off valves, may be installed sequentially from the upstream side of a gas flow. Gas supply pipes 232*d* and 232*e* may be connected to the gas supply pipes 232*a* and 232*b* on the downstream side of the valves 243*a* and 243*b*, respectively. Further, gas supply pipes 232*f* and 232*g* may be respectively connected to the gas supply pipe 232*c* on the downstream of the valve 243*c*. At the gas supply pipes 232*d* to 232*g*, MFCs 241*d* to 241*g* and valves 243*d* to 243*g* may be sequentially installed from the upstream side of the gas flow. The gas supply pipes 232*a* to 232*g* may be made of, for example, metal material such as stainless steel or the like.

As shown in FIG. 3, the nozzles 249*a* to 249*c* may be respectively arranged in an annular space in a plan view between the inner wall of the reaction tube 203 and the wafer 200 to extend upward from the lower side to the upper side of the inner wall of the reaction tube 203 in the arrangement direction of the wafers 200. That is, the nozzles 249*a* to 249*c* may be installed in a region existing on a lateral side of a wafer arrangement region in which the wafers 200 are arranged and horizontally surrounding the wafer arrangement region, to extend along the wafer arrangement region.

The nozzle 249*b* may be arranged to face a below-described exhaust port 231*a* on a straight line across centers of the wafers 200 loaded into the process chamber 201 in a plan view. Further, the nozzles 249*a* and 249*c* may be arranged to sandwich the straight line L passing through the nozzle 249*b* and a center or the exhaust port 231*a* from both sides along the inner wall of the reaction tube 203 (i.e., outer peripheries of the wafers 200). The straight line L is also a straight line passing through the nozzle 249*b* and the center of the wafer 200. That is, it may be said that the nozzle 249*c* is installed on the opposite side of the nozzle 249*a* with the straight line L interposed therebetween. The nozzles 249*a* and 249*c* may be arranged line-symmetrically with the straight line L as an axis of symmetry.

Gas supply holes 250*a* to 250*c* configured to supply gases may be formed on the side surfaces of the nozzles 249*a* to 249*c*, respectively. Each of the gas supply holes 250*a* to 250*c* is opened to face the exhaust port 231*a* in a plan view, and is capable of supplying gases toward the wafers 200. A plurality of gas supply holes 250*a* to 250*c* may be provided over a region from the lower side to the upper side of the reaction tube 203.

A precursor gas, for example, a gas containing silicon (Si) as a main element constituting a film formed on the wafer 200, i.e., a halosilane-based gas, which is a Si-containing gas, may be supplied from the gas supply pipe 232*a*. This halosilane-based gas may be supplied into the process chamber 201 via the MFC 241*a*, the valve 243*a*, and the nozzle 249*a*. Halosilane refers to silane containing Si and a halogen element. The halosilane-based gas may act as a film-forming gas, i.e., a Si source. The halogen element includes chlorine (Cl), fluorine (F), bromine (Br), iodine (I), and the like. As the halosilane-based gas, for example, a chlorosilane-based gas containing Si and Cl may be used.

For example, a fluorine (F)-containing gas may be supplied from the gas supply pipe 232*b*. The F-containing gas may be supplied into the process chamber 201 via the MFC 241*b*, the valve 243*b*, and the nozzle 249*b*. The F-containing gas may act as a modifying gas or an etching gas.

A reaction gas, for example, a hydrogen nitride-based gas, which is a nitrogen (N)-containing gas, may be supplied from the gas supply pipe 232*c* into the process chamber 201 via the MFC 241*c*, the valve 243*c*, and the nozzle 249*c*. The hydrogen nitride-based gas may act as a film-forming gas, i.e., a N source (nitriding gas).

A Si-containing gas, for example, an aminosilane-based gas (hereinafter also referred to as "AS gas"), which is a gas containing Si and an amino group, may be supplied from the gas supply pipe 232*g*. The AS gas may be supplied into the process chamber 201 via the MFC 241*g*, the valve 243*g*, the gas supply pipe 232*c*, and the nozzle 249*c*. The Si-containing gas may act as a modifying gas.

For example, an inert gas may be supplied from the gas supply pipes 232*d* to 232*f* into the process chamber 201 via the MFCs 241*d* to 241*f*, the valves 243*d* to 243*f*, the gas supply pipes 232*a* to 232*c*, and the nozzles 249*a* to 249*c*, respectively. The inert gas may act as a purge gas, a carrier gas, a dilution gas, or the like.

A film-forming gas supply system (a precursor gas supply system and a reaction gas supply system) may mainly include the gas supply pipes 232*a* and 232*c*, the MFCs 241*a* and 241*c*, and the valves 243*a* and 243*c*. Further, a Si-containing gas supply system (in other words, an AS gas supply system) may mainly include the gas supply pipe 232*g*, the MFC 241*g*, and the valve 243*g*. Furthermore, a F-containing gas supply system may mainly include the gas supply pipe 232*b*, the MFC 241*b*, and the valve 243*b*. In addition, an inert gas supply system may mainly include the gas supply pipes 232*d* to 232*f*, the MFCs 241*d* to 241*f*, and the valves 243*d* to 243*f*. The Si-containing gas supply system and the F-containing gas supply system may also be referred to a modifying gas supply system.

Any one or the entirety of the various supply systems described above may be configured as an integrated supply system 248 in which the valves 243*a* to 243*g*, the MFCs 241*a* to 241*g*, and the like are integrated. The integrated supply system 248 may be connected to each of the gas supply pipes 232*a* to 232*g*, and may be configured such that operations of supplying various gases into the gas supply pipes 232*a* to 232*g* (i.e., opening and closing operations of the valves 243*a* to 243*g*, flow rate regulation operations by the MFCs 241*a* to 241*g*, and the like) are controlled by a controller 121, which will be described later. The integrated supply system 248 may be configured as a one-piece integrated unit or a divided integrated unit, and may be attached/detached to/from the gas supply pipes 232*a* to 232*g* or the like on an integrated unit basis. As a result, maintenance, replacement, expansion, and the like of the integrated supply system 248 may be performed on an integrated unit basis.

An exhaust port 231*a* configured to exhaust the atmosphere in the process chamber 201 may be provided below the side wall of the reaction tube 203. As shown in FIG. 2, the exhaust port 231*a* may be provided at a position facing the nozzles 249*a* to 249*c* (more specifically, the gas supply holes 250*a* to 250*c*) across the wafers 200 in a plan view. The exhaust port 231*a* may be provided to extend from the lower side to the upper side of the side wall of the reaction tube 203, i.e., along the wafer arrangement region. An exhaust pipe 231 may be connected to the exhaust port 231*a*. A vacuum pump 246 as a vacuum exhauster may be connected to the exhaust pipe 231 via a pressure sensor 245 as a pressure detector configured to detect the pressure in the process chamber 201 and an Auto Pressure Controller (APC) valve 244 as a pressure regulator.

The APC valve 244 may perform or stop a vacuum exhausting operation in the process chamber 201 by being opened or closed while the vacuum pump 246 is in operation. Further, the APC valve 244 may be configured to be capable of regulating the pressure in the process chamber 201 by adjusting an opening state of the valve based on pressure information detected by the pressure sensor 245 while the vacuum pump 246 is in operation. An exhaust system may mainly include the exhaust pipe 231, the APC valve 244, and the pressure sensor 245. This exhaust system may include the vacuum pump 246.

Below the manifold 209, a seal cap 219 may be provided as a furnace opening lid capable of hermetically closing the lower end opening of the manifold 209. This seal cap 219 may be made of, for example, metal material such as stainless steel or the like, and may be formed in a substantially disc shape. An O-ring 220*b* as a seal configured to contact the lower end of the manifold 209 may be installed on the upper surface of the seal cap 219. Below the seal cap 219, a rotator 267 configured to rotate a below-described boat 217 may be installed. A rotary shaft 255 of the rotator 267 may be connected to the boat 217 via the seal cap 219. The rotator 267 may be configured to rotate the wafers 200 by rotating the boat 217.

The seal cap 219 may be vertically moved up or down by a boat elevator 115 as an elevator installed outside the reaction tube 203. The boat elevator 115 may function as a transfer apparatus configured to load or unload the wafers 200 into or out of the process chamber 201 by raising or lowering the seal cap 219.

The boat 217 serving as a substrate support may be configured to support a plurality of wafers 200, for example, 2 to 250 wafers 200, in such a state that the wafers 200 are arranged in a horizontal posture and in multiple stages along a vertical direction with the centers of the wafers 200 aligned with one another. That is, the boat 217 is configured to arrange the wafers 200 to be spaced apart from each other. This boat 217 may be made of, for example, heat-resistant material such as quartz or SiC. Below the boat 217, heat insulating plates 218 made of, for example, heat-resistant material such as quartz or SiC may be supported in multiple stages.

A temperature sensor 263 as a temperature detector may be installed in the reaction tube 203. By regulating a state of supplying electrical power to the heater 207 based on the temperature information detected by the temperature sensor 263, a temperature distribution inside the process chamber 201 may be a desired temperature distribution. This temperature sensor 263 may be installed, for example, along the inner wall of the reaction tube 203.

Figure 4:
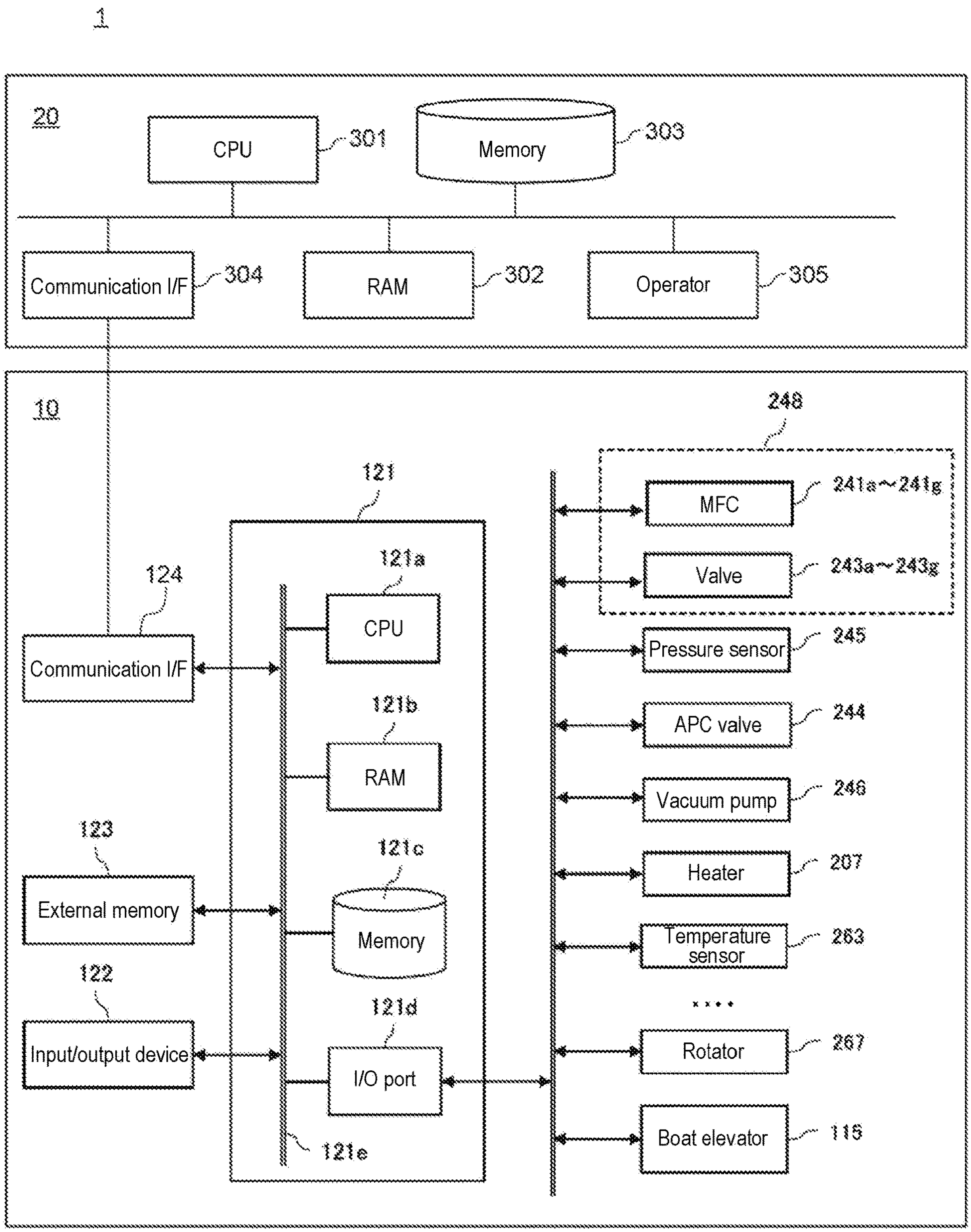
FIG. 4 is a schematic explanatory diagram schematically showing an example of a hardware configuration of a substrate processing system according to embodiments of the present disclosure.

FIG. 4 is a schematic explanatory diagram schematically showing an example of a hardware configuration of a substrate processing system according to embodiments of the present disclosure. In FIG. 4, one substrate processing apparatus 10 and one data manager 20 are shown for the sake of easy understanding.

The substrate processing apparatus 10 includes a controller 121 configured to be capable of controlling a series of processes for the wafers 200 as substrates and functioning as a below-described controller 11. As shown in FIG. 4, the controller 121 may be constituted by a computer at least including a Central Processing Unit (CPU) 121*a* as an example of a processor, a Random Access Memory (RAM) 121*b* as an example of a memory, a memory 121*c* as an example of a storage, and an input/output (I/O) port 121*d*. The RAM 121*b*, the memory 121*c*, and the I/O port 121*d* may exchange data with the CPU 121*a* via an internal bus 121*e*.

The memory 121*c* may include a non-transitory computer-readable recording medium such as a Read Only Memory (ROM), a flash memory, a Hard Disk Drive (HDD), or a Solid State Drive (SSD). The memory 121*c* may readably store a control program that controls each operation of the substrate processing apparatus 10, a process recipe describing procedures and conditions of substrate processing described later, and the like.

The above-described process recipe (hereinafter also simply referred to as "recipe") constitutes various information to be used when performing substrate processing, and includes at least one step for substrate processing. This recipe may include, for example, a plurality of steps that constitute a series of substrate processing, and control information for various components when performing each step. Further, this recipe may be a combination that causes the controller 121 to execute each procedure in the substrate processing to obtain a predetermined result, and may function as a program. As used herein, the term "program" may include a recipe, a control program, or both of them.

The RAM 121*b* may function as a memory area in which programs and data read by the CPU 121*a* are temporarily stored.

The I/O port 121*d* may be a port for connection to various components of the substrate processing apparatus 10 described above. For example, the MFCs 241*a* to 241*g*, the valves 243*a* to 243*g*, the pressure sensor 245, the APC valve 244, the vacuum pump 246, the temperature sensor 263, the heater 207, the rotator 267, the boat elevator 115, and the like may be connected to the I/O port 121*d*. The components connected to the I/O port 121*d* are not limited to those described above.

The CPU 121*a* may be configured to read a control program from the memory 121*c* and execute the control program, and may be configured to read a recipe from the memory 121*c* in response to the input of an operation command from a below-described input/output device 122. According to contents of the recipe thus read, the CPU 121*a* may control flow rate regulation operation for various gases by the MFC 241*a* to 241*g*, opening/closing operations of the valves 243*a* to 243*g*, opening/closing operation and pressure regulation operation of the APC valve 244, start and stop of the vacuum pump 246, temperature regulation operation of the heater 207 based on the temperature sensor 263, rotation and rotation speed adjustment operation of the boat 217 by the rotator 267, elevation operation of the boat 217 by the boat elevator 115, and the like.

The controller 121 with the configuration described above may be connected to an input/output device 122, an external memory 123, and a communication interface (UF) 124. Among them, the input/output device 122 may be a user interface including an input device such as a keyboard, a mouse, a touch panel, a pointer or the like, or a display such as a monitor or the like, alone or in combination.

The external memory 123 may include a non-transitory computer-readable recording medium, for example, a magnetic disk such as a HDD or the like, an optical disc such as a CD or the like, a magneto-optical disc such as a MO or the like, or a semiconductor memory such as a USB memory, a SSD or the like. At least one selected from the group of the external memory 123 and the memory 121*c* described above may function as a first memory 12, which will be described later.

The communication interface 124 may be an interface configured to enable wired or wireless communication for transmission and reception of various signals between the substrate processing apparatus 10 and the data manager 20. This communication interface 124 may function as a communicator 13, which will be described later.

Figure 5:
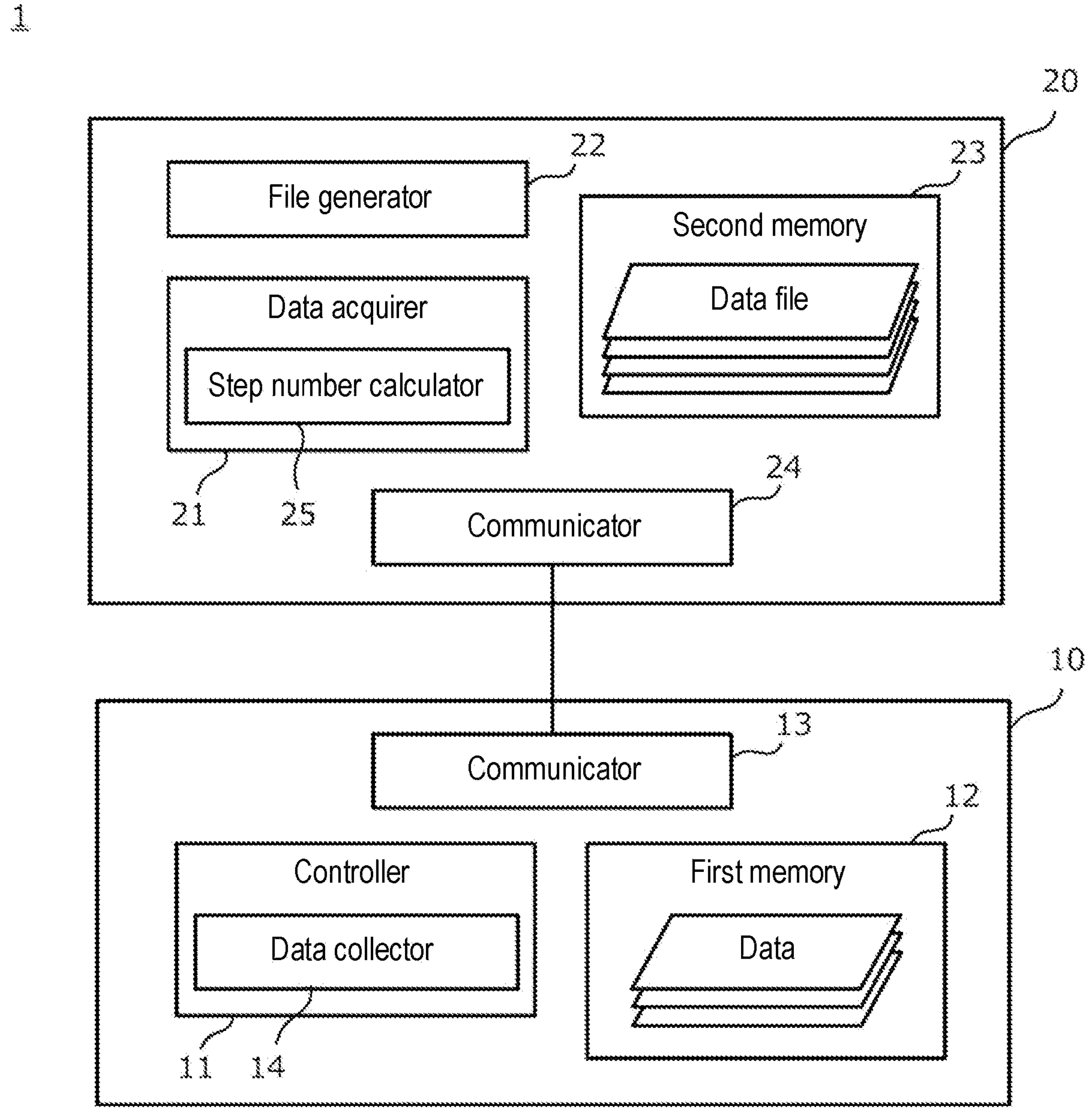
FIG. 5 is a functional block diagram showing an example of each function of a substrate processing system according to embodiments of the present disclosure.

FIG. 5 is a functional block diagram showing an example of each function of the substrate processing system according to embodiments of the present disclosure. As in FIG. 4, FIG. 5 also shows one substrate processing apparatus 10 and one data manager 20 for the sake of easy understanding. As shown in FIG. 5, the substrate processing apparatus 10 may include a controller 11, a first memory 12, and a communicator 13 on the side of the substrate processing apparatus.

The controller 11 may be realized mainly by the controller 121 described above. The controller 11 may control various components of the substrate processing apparatus 10 based on the recipe to process the substrates. Further, the controller 11 may include a data collector 14 configured to collect data that is reported during substrate processing performed based on the recipe.

The first memory 12 may be realized mainly by the memory 121*c* and the external memory 123 described above. The first memory 12 may store the data collected by the data collector 14. The data stored in the first memory 12 may be stored in association with the executed recipe, more specifically the respective steps in the recipe.

The communicator 13 on the side of the substrate processing apparatus may be realized mainly by the communication interface 124 described above. The communicator 13 on the side of the substrate processing apparatus may be configured to perform data communication with the data manager 20.

<Schematic Configuration of Data Manager>

The data manager 20 is connected to at least one substrate processing apparatus 10. Specifically, the data manager 20 according to the embodiments of the present disclosure may be an apparatus capable of managing a plurality of substrate processing apparatuses 10-1, 10-2, and for example, a group manager, a file server, or the like. The data manager 20 may be connectable to a data management server 2 via the Internet or the like. The data management server 2 may be a server capable of analyzing the file received from the data manager 20, for example, a Fault Detection and Classification (FDC) analysis server.

As shown in FIG. 4, the data manager 20 may include a computer at least including a CPU 301 as an example of a processor, a RAM 302 as an example of a memory, a memory 303 as an example of a storage, and a communication interface 304 configured to realize data communication among the substrate processing apparatuses 10-1, 10-2, and 10-3. The data manager 20 may also include an operator 305 through which an input operation is performed by a user (specifically, an apparatus operator, an apparatus manager, an apparatus engineer, a maintenance personnel, a worker, etc.).

The memory 303 may include, for example, a non-transitory computer-readable recording medium such as a ROM, a flash memory, a HDD, or a SSD. The memory 303 may readably store management information of each substrate processing apparatus 10-1, 10-2, or 10-3, data acquired from each substrate processing apparatus 10-1, 10-2, or 10-3, a data file obtained by converting data into a predetermined data format, and the like.

The CPU 301 may be used to control various operations in the data manager 20. Examples of the various operations in the data manager 20 may include acquiring data from each substrate processing apparatus 10-1, 10-2, or 10-3, and changing the data format of the acquired data.

The RAM 302 may function as a memory area (in other words, work area) in which data related to various operations executed by the CPU 301 are temporarily stored.

The communication interface 304 may be an interface that enables wired or wireless communication for transmission and reception of various signals between the data manager 20 and the respective substrate processing apparatuses 10-1, 10-2, and 10-3. A communication standard used in this communication interface 304 may conform to a communication standard of the communication interface 124 on the side of the substrate processing apparatus 10.

The operator 305 may be capable of receiving the input of operation commands from the user. Specifically, like the input/output device 122 of the substrate processing apparatus 10, the operator 305 may include a user interface including an input device, a display, or the like, alone or in combination.

The data manager 20 including the hardware configuration described above may mainly perform the following functions. That is, as shown in FIG. 5, the data manager 20 according to the embodiments of the present disclosure may include a data acquirer 21, a file generator 22, a second memory 23, and a communicator 24 on the side of the data manager. Among the configurations described above, the data acquirer 21 and the file generator 22 may be realized mainly by the CPU 301. Similarly, the second memory 23 may be realized mainly by the memory 303, and the communicator 24 may be realized mainly by the communication interface 304.

The data acquirer 21 may acquire data related to a specific recipe executed in a specific substrate processing apparatus 10 based on an operation command inputted by a user, or the like. In this regard, it should be noted that the data acquired by the data acquirer 21 according to the embodiments of the present disclosure is acquired on a step-by-step basis instead of recipe-by-recipe basis. In a case where the data is acquired on the step-by-step basis in this way, a data size of the acquired data may be kept smaller than when the data is acquired on the recipe-by-recipe basis. This prevents the data size of the acquired data from exceeding a memory capacity of the data manager 20.

The file generator 22 may be configured to generate files of the data acquired by the data acquirer 21 on a recipe-by-recipe basis. The file generator 22 may convert data constituted by sensor output time-series data (e.g., raw waveform data of various sensors) into files of different data formats. More specifically, the file generator 22 may be capable of converting the acquired data into a file of data format that may be easily analyzed by the data management server 2 or the like, for example, a JSON format file. Further, the file generator 22 may be capable of converting the acquired data into, for example, a CSV format file or a XML format file. By performing such data conversion, data analysis may be performed smoothly. In addition, the data format of the file may be specified in advance. By specifying the data format, it is possible to provide data suitable for the use of the file.

In addition, since the data acquired by the data acquirer 21 is acquired on a step-by-step basis, the file generation by the file generator 22 on a recipe-by-recipe basis may not be completed by data conversion of one data alone. Therefore, among the data acquired by the data acquirer 21, the data included in the same recipe may be integrated and saved as one file. As a result, the data files saved in the second memory 23 may be files generated on a recipe-by-recipe basis, which facilitates the use of data in a subsequent process such as analysis or the like. As a method of integrating and saving data in one file, files may be generated collectively at a stage when the entirety of the data constituting one recipe is acquired. Alternatively, at the timing of converting the acquired data into a file, it may be possible to check whether a file of data constituting the same recipe is already created, and in a case where the file of data constituting the same recipe is already created, one file may be updated by writing the most recently acquired data in the file.

The second memory 23 may save the data acquired by the data manager 20 as a file. More specifically, the second memory 23 may store a data file generated by converting the data acquired by the data acquirer 21 into a file for each recipe by the file generator 22. A plurality of data files acquired from the substrate processing apparatuses 10-1, 10-2 and 10-3 and generated as files may be stored in the second memory 23.

The second memory 23 may include a capacity monitor (not shown) configured to monitor its data capacity. The capacity monitor monitors the data capacity, particularly the remaining data capacity of the second memory 23. In a case where the files are saved exceeding the remaining data capacity when saving a new file, old files in the second memory 23 may be deleted. In this way, by monitoring the remaining data capacity of the second memory 23 and deleting the old files when the data capacity of the new file exceeds the remaining data capacity, it is possible to eliminate file storage errors.

In addition, when the old files mentioned above are deleted, a notification that the files are deleted may be performed as history information. This notification may be performed via, for example, the operator 305 of the data manager 20. By performing such notification, the user may be notified that the old files are deleted. Therefore, it is possible to urge the user to organize the data in the second memory 23.

The communicator 24 on the side of the data manager may be configured to perform data communication with each of the substrate processing apparatuses 10-1, 10-2, and 10-3. In addition, the communicator 24 on the side of the data manager may perform data communication with, for example, an external apparatus such as the data management server 2 or the like.

As described above, the data acquirer 21 acquires data on a step-by-step basis. For example, in a case where the data is acquired at every step (or several steps) to reduce the data size of the data to be acquired at one time, the data size of the data to be acquired is small. However, it may take a long time to acquire data related to one recipe.

More specifically, as described above, the data reported during substrate processing are saved in the first memory 12 in the substrate processing apparatus 10. Therefore, when acquiring specific data in the data manager 20, the inside of the first memory 12 is searched to acquire the corresponding data. On the other hand, a time taken during execution of steps included in the recipe (hereinafter referred to as "step execution time") is usually different for each step, and may be as short as 1 second. Further, it is assumed that the number of steps constituting one recipe may exceed 100 steps. Then, for example, when the data acquirer 21 tries to acquire data of a recipe that includes many relatively short steps and includes a relatively large total number of steps, in a case where the data is searched and acquired for each step as described above, a time taken during the search of data may be longer than the step execution time. In addition, since overhead time usually occurs each time data is searched, a time taken during data acquisition increases in proportion to the number of searches. Under these circumstances, simply acquiring data on a step-by-step basis may cause an event in which it takes a long time to create a file.

In consideration of the above points, the data acquirer 21 according to the embodiments of the present disclosure is configured to include a step number calculator 25 configured to calculate the number of steps corresponding to the data that may be acquired at one time, in addition to acquiring data on a step-by-step basis.

Figure 6:
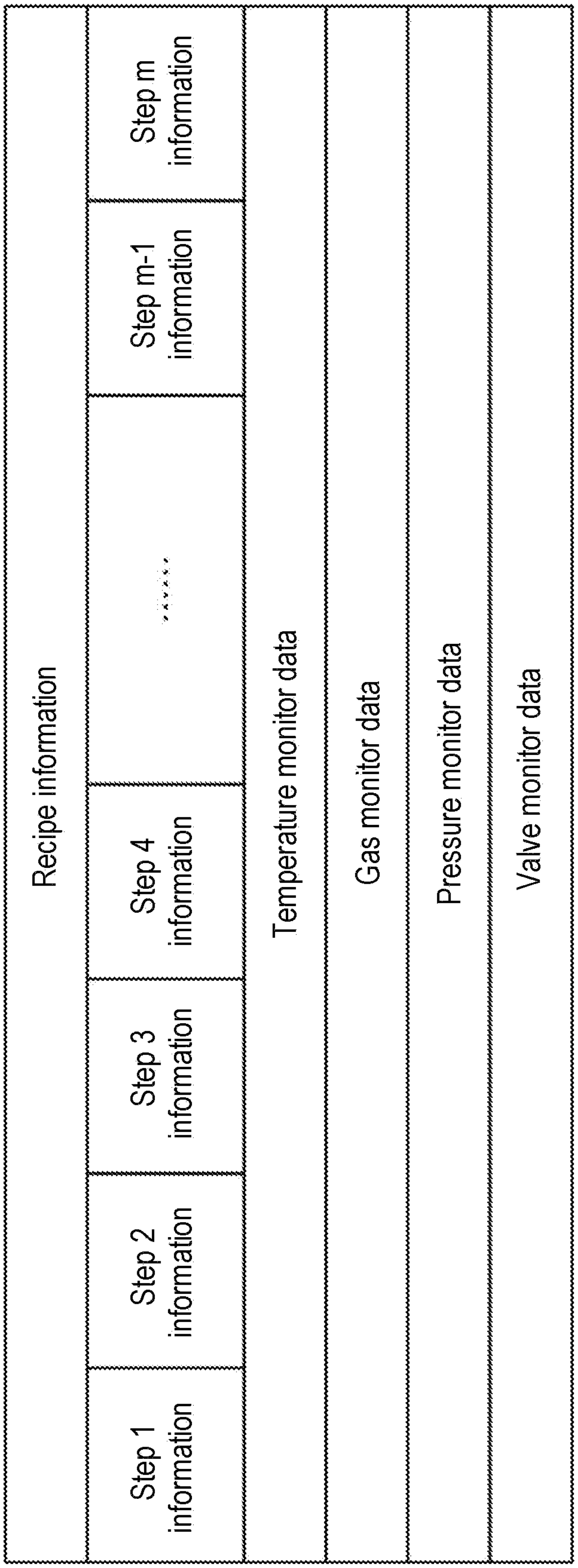
FIG. 6 is a schematic diagram of data corresponding to one recipe acquired by a data manager.

FIG. 6 is a schematic diagram showing one piece of recipe information acquired by the data manager and the data corresponding thereto. The data constituting one recipe, which is acquired by the data manager 20, particularly the data acquirer 21, may include time-series monitor data of sensors in the substrate processing apparatus 10 reported during recipe execution and associated with information about each step as shown in FIG. 6. In addition, for example, as shown in FIG. 6, the recipe information may include information on m steps (m is an integer equal to or greater than 1) arranged in time-series order. The information on each step may include the step execution time.

As shown in FIG. 6, the data according to the embodiments of the present disclosure may include monitor data for the temperature inside the process furnace 202, monitor data for the supply amounts of various gases supplied from the gas supply pipes 232*a* to 232*g*, monitor data for the pressure inside the process furnace 202, and monitor data for the opening/closing state of the APC valve 244 (or the valves 243*a* to 243*g*). Among the above-described monitor data, the temperature inside the process furnace 202 may be specified by referring to the output signal of the temperature sensor 263, the gas supply amounts may be specified by referring to the output signals of the MFCs 241*a* to 241*g*, and the pressure inside the process furnace 202 may be specified by referring to the output signal of the pressure sensor 245.

For example, when acquiring data constituting one recipe including m steps as shown in FIG. 6, the data acquirer 21 according to the embodiments of the present disclosure acquires the data multiple times on a step-by-step basis. At that time, the number of steps included in the data acquired at one time is calculated by the step number calculator 25.

The step number calculator 25 may be capable of calculating the number of steps constituting data that may be obtained at one time when acquiring data of a specific recipe. For the calculation of the number of steps constituting the data to be acquired, the step number calculator 25 predefines a data acquirable range (or simply referred to as a "range").

The data acquirable range is a value set in consideration of the capacity of the memory, and may indicate, for example, a time from a start to an end of acquisition of the data acquired by the data manager 20. In this regard, a step execution time may be set for each step that constitutes the recipe. Then, the step number calculator 25 may calculate the number of steps falls within the data acquirable range by using the step execution time set for each step. In this way, by referring to the step execution time of the data to be acquired, from the data acquirable range and regulating the data size of the data, it is relatively easy to regulate the data size of the data to be acquired at one time to an optimum size.

The data acquirable range described above may be set in consideration of the number of components capable of detecting data that the substrate processing apparatus 10 may collect during substrate processing. In other words, the data acquirable range may be changed according to the number of sensors connected to the substrate processing apparatus 10. Specifically, the data size of acquired data may be stabilized regardless of the functions of the substrate processing apparatus 10 by setting the data acquirable range to be relatively short when the number of sensors in the substrate processing apparatus 10 is relatively large, and setting the data acquirable range to be relatively long when the number of sensors in the substrate processing apparatus 10 is relatively small. Therefore, a data acquirable range T according to the embodiments of the present disclosure is specified by the following formula (1).

$$T = \frac{F}{\alpha} \times \frac{1}{S} \tag{1}$$

In the formula (1), S is the number of sensors of the substrate processing apparatus 10, F is a maximum allowable data size, and α is an output file size of sensor data per second. The data size F provides a margin of at least 10% to an allowable amount of available memory, and is a threshold value set such that data exceeding the allowable amount of available memory is not acquired.

Figure 7:
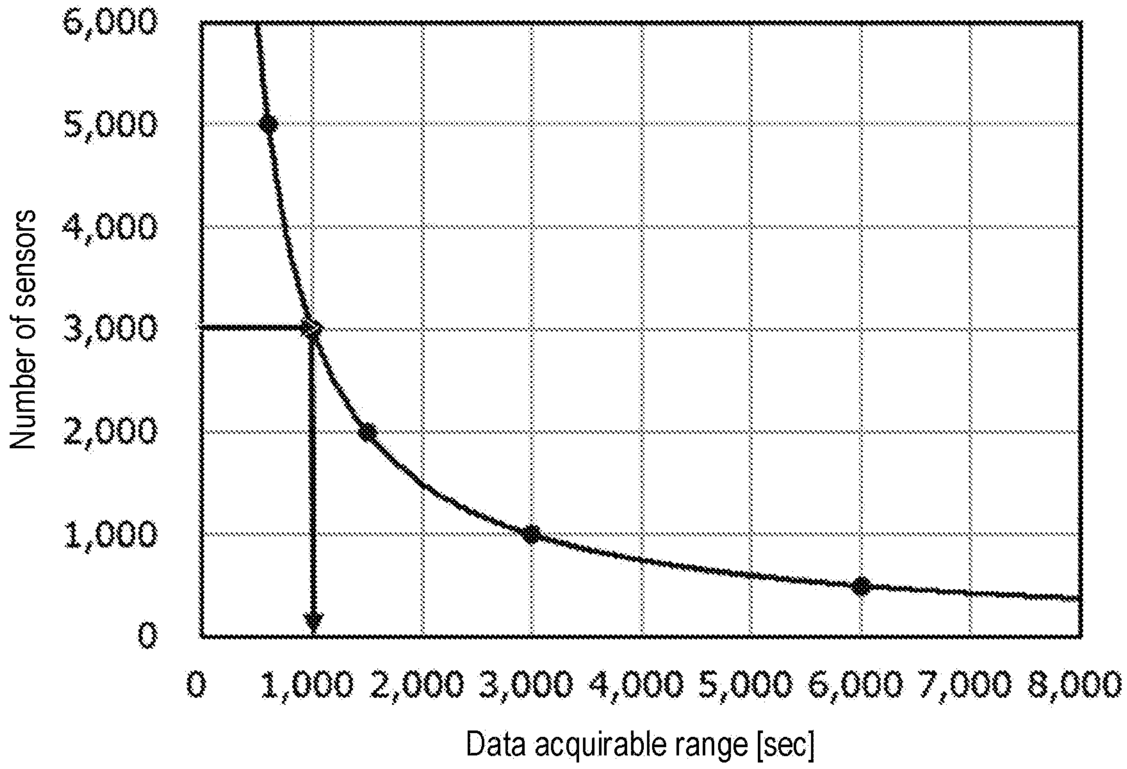
FIG. 7 is a graph showing a relationship between the number of sensors in a substrate processing apparatus and a data acquirable range.

FIG. 7 is a graph showing a relationship between the number of sensors in the substrate processing apparatus and the data acquirable range. FIG. 7 exemplarily shows the relationship between the number of sensors in the substrate processing apparatus 10 specified by the above formula (1) and the data acquirable range. In the graph shown in FIG. 7, for example, the allowable maximum data size F of data acquired at one time is set to 1.8 gigabytes (GB), and an output file size a of sensor data per second is set to 600 bytes/second.

According to the example shown in FIG. 7, for example, when the number of sensors mounted on the substrate processing apparatus 10 is 3000, the data acquirable range (i.e., a time from a start to an end of acquisition of one data to be acquired) may be set to 1000 seconds. The "number of sensors" referred to herein may include the number of actuators related to the generation of monitor data, such as the MFCs 241*a* to 241*g* and the APC valves 244, as well as the number of the temperature sensors 263 and the pressure sensors 245. In this case, actuator control signals may be used to generate monitor data.

The number of steps may be calculated by the following method in the step number calculator 25 in which the above-described data acquirable range is defined. That is, when acquiring data of a specific recipe, first, it is checked whether the step execution time set for one step included in the data acquired at one time is equal to or less than a predefined data acquirable range. In a case where a step execution time of one step is equal to or less than the data acquirable range, the step execution time of the one step is added to a data acquisition time, and then one or more steps subsequent to the one step of the data to be acquired are added. Then, by performing, one or more times, the above-described operation of adding steps until immediately before the data acquirable range is exceeded, it is possible to specify the number of steps in which the data acquisition time of the data to be acquired is the same as or slightly shorter than the data acquirable range. Therefore, it is possible to calculate the number of steps included in the acquired data.

The number of steps calculated by the above-described method is used when specifying the number of steps included in the data acquired by the data acquirer 21, and the data corresponding to the number of steps specified here is acquired from the substrate processing apparatus 10 by the data acquirer 21. The calculation of the number of steps and acquisition of data described above may be performed sequentially until the acquisition of the entirety of data included in one recipe is completed.

By acquiring data by the above-described method, it is possible to reduce the data size of the acquired data, and it is possible to substantially prevent the data size of the acquired data from exceeding the data size that may be held in the memory (i.e., the RAM 302) of the data manager 20. In addition, it is possible to suppress lengthening of the time taken during data acquisition due to lengthening of the data search time as in the case of acquiring data on the step-by-step basis. As described above, in the substrate processing system and the substrate processing apparatus according to the embodiments of the present disclosure, the data held by the substrate processing apparatus 10 may be stably acquired.

<Method of Manufacturing Semiconductor Device>

Next, a method of manufacturing a semiconductor device according to the embodiments of the present disclosure will be described. An example is shown in which the method of manufacturing a semiconductor device described below is implemented by using the substrate processing system 1 described above. However, the method of manufacturing a semiconductor device according to the embodiments of the present disclosure may also be implemented in a substrate processing system other than the substrate processing system 1. In the following description, among a series of manufacturing processes as a method of manufacturing a semiconductor device, a process will be mainly described in which data corresponding to an arbitrary recipe (e.g., the recipe shown in FIG. 6) executed in one substrate processing apparatus 10 is acquired in one data manager 20 and a file is generated. As for the specific structures and the like of the substrate processing apparatus 10 and the data manager 20, the description given above is incorporated, and the detailed description thereof is omitted here.

Figure 8:
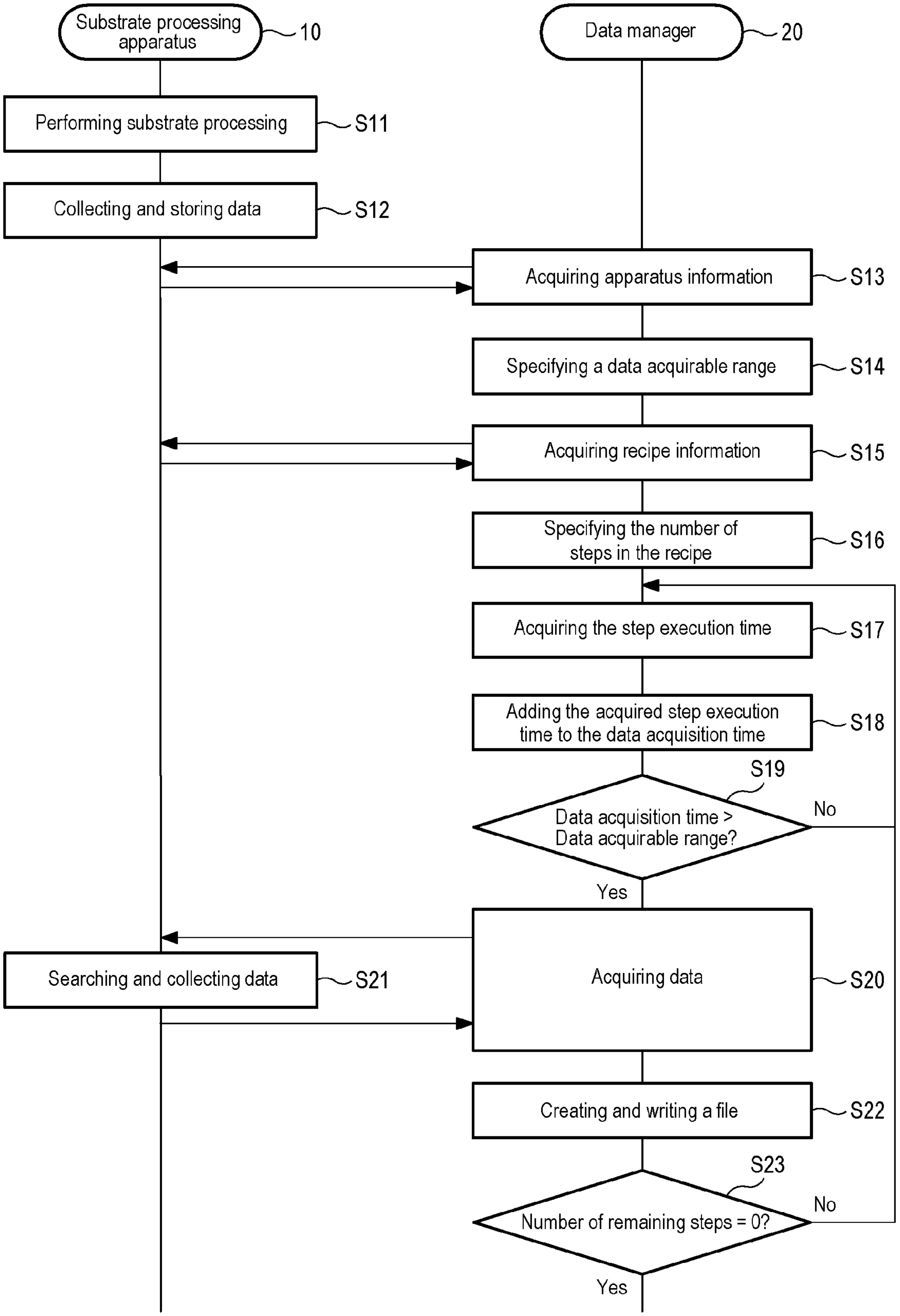
FIG. 8 is a sequence diagram showing an example of a method of manufacturing a semiconductor device according to embodiments of the present disclosure.

FIG. 8 is a sequence diagram showing an example of a method of manufacturing a semiconductor device according to embodiments of the present disclosure. In the method of manufacturing a semiconductor device according to the embodiments of the present disclosure, first, substrates are processed in the substrate processing apparatus 10 according to a recipe including at least one step (step S11). Data reported during the processing of the substrates is collected by the data collector 14 and stored in the first memory 12 in association with each step in the recipe (step S12). Steps S11 and S12 described above may be performed regardless of the subsequent steps, or may be performed in parallel with the subsequent steps.

For example, when the acquisition of data of a specific recipe is requested by a user inputting an operation command or the like, the data manager 20 executes a process of acquiring the pertinent data. Specifically, first, the apparatus information on the substrate processing apparatus 10, which is a target of data acquisition, is acquired (step S13). The apparatus information acquired here may include at least information on the number of sensors included in the substrate processing apparatus 10. Moreover, step S13 may be stored in the data manager 20 in advance before executing the process of acquiring data.

After obtaining the apparatus information on the substrate processing apparatus 10, the data manager 20 specifies a data acquirable range used by the step number calculator 25 based on the apparatus information (step S14). In the embodiments of the present disclosure, the data acquirable range is specified as an arbitrary time.

The data manager 20 then acquires recipe information on the data to be acquired from the substrate processing apparatus 10 (step S15). It is assumed that the recipe information includes at least one step. Further, this step may include a step execution time. After acquiring the recipe information, the data manager 20 specifies a total number of steps n (where n is an integer equal to or greater than 1) included in the recipe to be acquired (step S16). At this time, in addition to the total number of steps, the step execution time of each step may be specified.

After the number of steps of the recipe is specified, the method of manufacturing a semiconductor device according to the embodiments of the present disclosure then calculates the number of steps included in the data to be acquired such that the data to be acquired falls within the data acquirable range when acquiring data (steps S17 to S19). In the following description, as a specific example, a case of acquiring recipe data shown in FIG. 6 will be described.

When calculating the number of steps included in the data to be acquired, first, the step execution time of one of the steps included in the recipe, for example, step 1 which is executed the earliest in the recipe shown in FIG. 6, is acquired (step S17). Next, the step execution time of step 1 acquired in step S17 is added to a data acquisition time (step S18). The data acquisition time referred to here is a time obtained by adding the step execution time of the step that may be included in the data acquired at one time.

The data acquisition time updated in step S18 is compared with the data acquirable range specified in step S14 to determine whether the data acquisition time exceeds the data acquirable range (step S19). In a case where the data acquisition time is equal to or less than the data acquirable range (in a case where no in step S19), the process returns to step S17 to perform steps S17 to S19 for the step to be executed after the one step, for example, step 2 in FIG. 6.

The above-described steps S17 to S19 are performed, one or more times, until the data acquisition time exceeds the data acquirable range. Then, in a case where the data acquisition time exceeds the data acquirable range (in a case where "Yes" in step S19), the step corresponding to the step execution time added to the data acquisition time so far is specified as the number of steps of the data to be acquired at one time. However, the number of steps does not include the step corresponding to the step execution time added to the most recent data acquisition time. Specifically, for example, when the step execution time of step 4 is added to the data acquisition time and, consequently, the data acquisition time exceeds the data acquirable range, the steps corresponding to the step execution time added until immediately before the step execution time of step 4 is added, i.e., steps 1 to 3 are specified as the number of steps included in the data acquired at one time.

After the number of steps included in the data to be acquired at one time is specified, the data manager 20 requests the substrate processing apparatus 10 for the data corresponding to the specified number of steps via the communicator 24 (step S20). Upon receiving the above-described request, the substrate processing apparatus 10 searches the first memory 12 to collect relevant data (step S21), and sends the collected data to the data manager 20 via the communicator 13. In addition to specifying the number of steps, in a case where the number of steps included in the data requested in step S20 is subtracted from the number of steps specified in step S16, it may be easy to specify the number of remaining steps to be acquired in step S23, which will be described later.

When the requested data is received from the substrate processing apparatus 10, the data manager 20 converts the acquired data into a data format specified in advance by the file generator 22, thereby creating a file (step S22). At this time, in a case where a file of data related to the same recipe was already created, the data received at the present time may be converted and written into the already created file, thus creating a file.

After the file generation is completed in step S22, the data manager 20 checks whether or not there is a step that is not yet acquired in the same recipe. Specifically, the data manager 20 determines whether or not the number of remaining steps specified in step S16 and updated in accordance with step S20 is zero (step S23). In a case where the number of remaining steps is not zero (in a case where "No" in step S23), there remains data to be acquired. Therefore, the process returns to step S17 to perform the series of steps one or more times. Specifically, while the data corresponding to steps 1 to 3 being acquired in the most recent step S20, the steps after step S17 are executed again to acquire the data corresponding to step 4 and subsequent steps. At this time, the data acquisition time updated in the most recent calculation step may be reset.

In step S23, in a case where the number of remaining steps is specified as zero (in a case where "Yes" in step S23), the data manager 20 determines that the entirety of the data of the specific recipe are acquired, and completes the series of processes of acquiring data. At this time, the file generated in step S22 may be saved in the second memory 23 as a data file generated on a recipe-by-recipe basis.

In a case where the steps after step S17 described above are performed one or more times, the number of remaining steps may become zero before the data acquisition time reaches the data acquirable range. In that case, step S19 may be skipped, the number of steps corresponding to the step execution time added to the data acquisition time thus far may be specified as the number of steps included in the data to be acquired at one time, and step S20 and subsequent steps may be performed.

In addition, in most cases, the step execution time of one step is generally relatively short (e.g., several seconds to several minutes). However, it is assumed that depending on the case, the step execution time of one step is long and the step execution time of the one step alone may exceed the data acquirable range. In such a case, the one step may be divided into two or more divided steps, and each divided step may be treated as one step. By adopting such measures, even when acquiring data of a recipe that includes steps with a long step execution time, the data size of the data acquired at one time may be regulated to an optimum size.

The method of manufacturing a semiconductor device according to the embodiments of the present disclosure described above may be realized by causing the controller 121 of the substrate processing apparatus 10 and the CPU 301 of the data manager 20 to operate each component. Therefore, the method of manufacturing a semiconductor device described above may be provided in the form of a program stored in an arbitrary recording apparatus or the like and configured to cause the controller 121 and the CPU 301 to execute predetermined processes. In addition, this program may be provided in the form of an application provided by a server (not shown) arranged on a network, or a cloud-based data processing platform, or may be provided in the form stored in a non-transitory computer-readable recording medium.

As described above, according to the substrate processing system 1, the substrate processing apparatus 10, and the method of manufacturing a semiconductor device according to the embodiments of the present disclosure, it is possible to stably acquire the data held by the substrate processing apparatus.

As an option, in the substrate processing system 1, the substrate processing apparatus 10, and the method of manufacturing a semiconductor device described above, the data acquirable range is exemplified as the time from the start to the end of data acquisition. However, the present disclosure is not limited thereto. Specifically, the data acquirable range may be the data capacity associated with the memory capacity of the data manager 20. The data acquirable range in this case may be, for example, 1.8 GB or less. By setting the data capacity as the data acquirable range in this way, it is possible to regulate the data size of the data to be acquired at one time to the optimum size, as in the case of the above-mentioned time.

As another form, the data manager 20 may be included in the substrate processing apparatus 10 to generate a data file in the substrate processing apparatus 10. In this case, the communication interface 124 may be connected to the data management server 2 via the Internet or the like, and may pass the generated data file to the data management server 2. Also in this embodiment, the same effects as the above-described embodiments may be obtained. Further, in this embodiment, the data file is generated and managed by the substrate processing apparatus alone. Therefore, a data communication load on the network may be reduced.

The above-described embodiments of the present disclosure are examples. The present disclosure is not limited to the above-described embodiments, and various modifications may be made without departing from the scope of the present disclosure. Such modifications are included in the technical idea of the present disclosure. In addition, in the present disclosure, a single number of each component or a plural number of each component may be present as long as there is no contradiction. Furthermore, the various embodiments and modifications described above may be used in combination as appropriate.

According to the present disclosure in some embodiments, it is possible to stably acquire data held by a substrate processing apparatus.

While certain embodiments are described above, these embodiments are presented by way of example, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing system, comprising:
at least one substrate processing apparatus including a controller configured to be capable of controlling processing of a substrate according to a recipe including at least one processing step defining conditions for substrate processing and a first memory configured to be capable of storing data of the at least one substrate processing apparatus that is reported during the processing of the substrate; and
a data manager connected to the at least one substrate processing apparatus, and configured to:
determine whether the recipe includes a specific step, data for which is equal to or less than a predefined data acquirable range;
in response to determining that the recipe includes the specific step, the data for which is equal to or less than the predefined data acquirable range, specify a number of at least one step, which includes the specific step, among the at least one processing step, such that data for the at least one step falls within the predefined data acquirable range; and acquire the data for the at least one step.

2. The substrate processing system of claim 1, wherein the predefined data acquirable range is capable of varying according to the number of sensors connected to the at least one substrate processing apparatus.

3. The substrate processing system of claim 1, wherein a step execution time is set for the at least one processing step.

4. The substrate processing system of claim 3, wherein the predefined data acquirable range indicates a range of time from a start to an end of acquisition of the data acquired by the data manager.

5. The substrate processing system of claim 4, wherein the data manager is further configured to, when a step execution time that is set for the specific step is equal to or less than the predefined data acquirable range, specify the number of the at least one step, by adding one or more steps subsequent to the specific step and by performing, one or more times, an operation of adding the one or more steps subsequent to the specific step immediately before a total of step execution times of the added one or more steps and the specific step exceeds the predefined data acquirable range.

6. The substrate processing system of claim 1, wherein the data manager includes a second memory configured to save the acquired data as a file.

7. The substrate processing system of claim 6, wherein the file is stored in the second memory on a recipe-by-recipe basis, and the data included in the same recipe is stored as one file.

8. The substrate processing system of claim 6, wherein the data is saved as the file in the second memory in a data format different from a data format when the data is acquired by the data manager.

9. The substrate processing system of claim 8, wherein the data format of the file is capable of being specified in advance.

10. The substrate processing system of claim 5, wherein the data manager is further configured to be capable of, when the step execution time that is set for the specific step exceeds the predefined data acquirable range, dividing the specific step and acquiring data that corresponds to the divided specific step.

11. The substrate processing system of claim 1, wherein a data size that is capable of being acquired in the predefined data acquirable range is 1.8 GB or less.

12. The substrate processing system of claim 7, wherein the data manager is further configured to monitor a capacity of the second memory, and to delete old files in the second memory when the file is saved in excess of the capacity.

13. The substrate processing system of claim 12, wherein when the old files are deleted, the data manager is further configured to notify that the old files are deleted as history information.

14. A substrate processing apparatus, comprising:

a memory configured to be capable of storing data of the substrate processing apparatus that is reported during a processing of a substrate;

a communicator configured to be capable of being connected to a data manager configured to acquire the stored data; and a controller configured to be capable of:

controlling the processing of the substrate according to a recipe including at least one processing step defining conditions for substrate processing;

determining whether the recipe includes a specific step, data for which is equal to or less than a predefined data acquirable range; and in response to determining that the recipe includes the specific step, the data for which is equal to or less than the predefined data acquirable range, when a number of at least one step, which includes the specific step, among the at least one processing step, is specified such that data for the at least one step acquired by the data manager falls within the predefined data acquirable range, instructing the memory to collect the data for at least one step among the at least one processing step.

15. A method of manufacturing a semiconductor device, comprising:

performing processing of a substrate according to a recipe including at least one processing step defining conditions for substrate processing;

storing data of an apparatus that is reported during the processing of the substrate; and determining whether the recipe includes a specific step, data for which is equal to or less than a predefined data acquirable range;

in response to determining that the recipe includes the specific step, the data for which is equal to or less than the predefined data acquirable range, specifying a number of at least one step, which includes the specific step, among the at least one processing step, such that data for the at least one step falls within the predefined data acquirable range; and acquiring the data for the at least one step.

16. A non-transitory computer-readable recording medium storing a program that causes, by a computer, a substrate processing apparatus to perform the method of claim 15.

* * * * *